(12) United States Patent
Golara

(10) Patent No.: US 11,190,135 B2
(45) Date of Patent: Nov. 30, 2021

(54) LOW POWER DIFFERENTIAL CRYSTAL OSCILLATOR CIRCUIT

(71) Applicant: QUALCOMM Incorporated, San Diego, CA (US)

(72) Inventor: Soheil Golara, San Jose, CA (US)

(73) Assignee: Qualcomm Incorporated, San Diego, CA (US)

( * ) Notice: Subject to any disclaimer, the term of this patent is extended or adjusted under 35 U.S.C. 154(b) by 0 days.

(21) Appl. No.: 16/674,996

(22) Filed: Nov. 5, 2019

(65) Prior Publication Data

US 2021/0135627 A1    May 6, 2021

(51) Int. Cl.
    *H03B 5/36*      (2006.01)

(52) U.S. Cl.
    CPC ................... *H03B 5/364* (2013.01)

(58) Field of Classification Search
    CPC .................................................... H03B 5/364
    See application file for complete search history.

(56) References Cited

U.S. PATENT DOCUMENTS

| | | | | |
|---|---|---|---|---|
| 3,890,580 A | * | 6/1975 | Kuhn, Jr. | ............... H03B 5/364 331/116 FE |
| 6,696,898 B1 | | 2/2004 | Ward et al. | |
| 7,511,590 B1 | | 3/2009 | Gehring | |
| 7,683,730 B2 | | 3/2010 | Cetin et al. | |
| 9,490,746 B1 | * | 11/2016 | Madala | ................... H03B 5/364 |
| 2006/0176121 A1 | * | 8/2006 | Satoh | ..................... H03B 5/364 331/158 |
| 2014/0070897 A1 | * | 3/2014 | Brekelmans | .............. H03L 5/00 331/109 |

OTHER PUBLICATIONS

Chang Y., et al., "A Differential Digitally Controlled Crystal Oscillator With a 14-Bit Tuning Resolution and Sine Wave Outputs for Cellular Applications," IEEE Journal of Solid-State Circuits, vol. 47, No. 2, Feb. 2012, 421-434 pp.
Ruffieux D., "A High-Stability, Ultra-Low-Power Differential Oscillator Circuit for Demanding Radio Applications," Proceedings of the 28th European Solid-State Circuits Conference, 2002, pp. 85-88.

* cited by examiner

*Primary Examiner* — Jeffrey M Shin
(74) *Attorney, Agent, or Firm* — Loza & Loza LLP

(57) ABSTRACT

Aspects of the disclosure are directed to a low power differential circuit. In accordance with one aspect, the low power differential circuit includes a crystal oscillator to generate a differential sinusoidal waveform, the crystal oscillator having a first terminal and a second terminal; a first capacitor coupled to the first terminal; a first inverter including a first input coupled to the first terminal and a first output coupled to the first capacitor; a second capacitor coupled to the second terminal; and a second inverter including a second input coupled to the second terminal and a second output coupled to the second capacitor, wherein the first inverter and the second inverter generate a synchronous square wave signal.

28 Claims, 3 Drawing Sheets

| Corner | Typ | FF cold | FF hot | SS cold | SS hot | SF cold | SF hot | FS cold | FS hot |
|---|---|---|---|---|---|---|---|---|---|
| i_core_uA | 185 | 230 | 264 | 117 | 142 | 166 | 193 | 170 | 198 |
| i_load_buffer_uA | 95 | 81 | 110 | 82 | 103 | 84 | 105 | 85 | 108 |
| PN_1M | -167 | -170 | -167 | -165 | -153 | -168 | -166 | -168 | -165 |
| PN_100K | -166 | -168 | -166 | -162 | -162 | -167 | -164 | -167 | -165 |
| PN_10k | -161.5 | -162.8 | -160.5 | -155.3 | -156.1 | -160.3 | -157.2 | -160.1 | -159.2 |

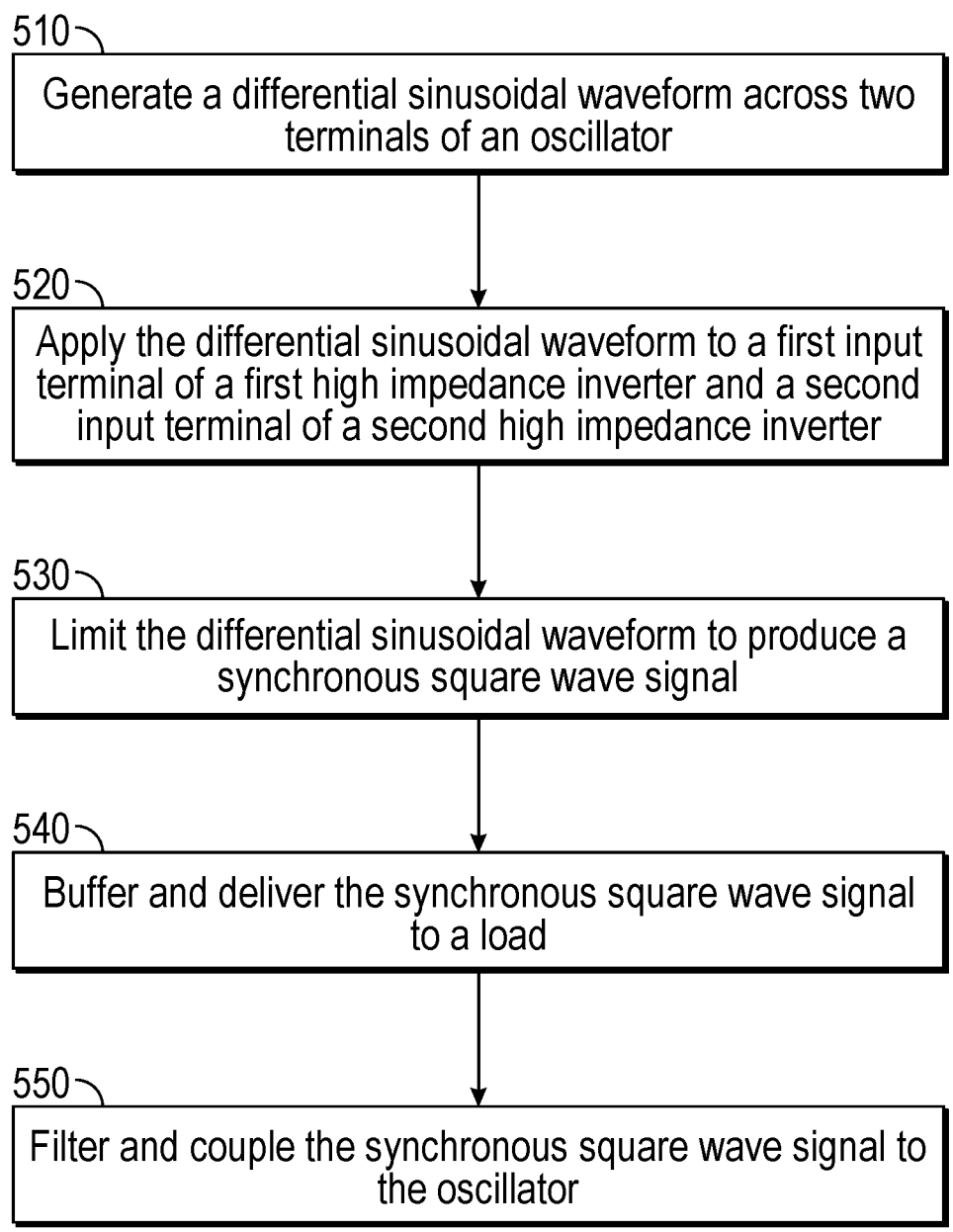

LOW POWER DIFFERENTIAL CRYSTAL OSCILLATOR CIRCUIT

TECHNICAL FIELD

This disclosure relates generally to the field of crystal oscillator circuits, and, in particular, to a low power differential crystal oscillator circuit.

BACKGROUND

Many electronic devices require a frequency reference as a source of periodic signals (e.g., for recurrent sequencing or frequency conversion). In addition, these devices may require a timing reference for synchronization (e.g., for timing coordination). One type of frequency reference uses a crystal oscillator. A timing reference may be implemented using a frequency reference and an associated counter circuit. In one aspect, low duty cycle devices (which may be battery-powered) may need a low power oscillator circuit as a frequency reference to allow autonomous long-life operation. Therefore, there are many applications which use a plurality of low duty cycle devices with needs for low power oscillator circuits.

SUMMARY

The following presents a simplified summary of one or more aspects of the present disclosure, in order to provide a basic understanding of such aspects. This summary is not an extensive overview of all contemplated features of the disclosure, and is intended neither to identify key or critical elements of all aspects of the disclosure nor to delineate the scope of any or all aspects of the disclosure. Its sole purpose is to present some concepts of one or more aspects of the disclosure in a simplified form as a prelude to the more detailed description that is presented later.

In one aspect, the disclosure provides low power differential crystal oscillator circuit. Accordingly, a low power differential circuit, including: a crystal oscillator to generate a differential sinusoidal waveform, the crystal oscillator having a first terminal and a second terminal; a first capacitor coupled to the first terminal; a first inverter including a first input coupled to the first terminal and a first output coupled to the first capacitor; a second capacitor coupled to the second terminal; and a second inverter including a second input coupled to the second terminal and a second output coupled to the second capacitor, wherein the first inverter and the second inverter generate a synchronous square wave signal.

In one example, the crystal oscillator generates a first sinusoidal signal having a first phase offset at the first terminal and wherein the first sinusoidal signal is part of the differential sinusoidal waveform. In one example, the crystal oscillator further generates a second sinusoidal signal having a second phase offset at the second terminal and wherein the second sinusoidal signal is part of the differential sinusoidal waveform. In one example, a difference of the first phase offset and the second phase offset is approximately 180 degrees within a phase tolerance. In one example, the phase tolerance is +/−1 degree or smaller.

In one example, the first sinusoidal signal serves as an input to the first inverter at the first input. In one example, the first inverter outputs a first square wave signal at the first output, wherein the first square wave signal is part of the synchronous square wave signal. In one example, the first square wave signal has a substantially same frequency as the first sinusoidal signal. In one example, the first capacitor operates as an alternating current (AC) coupler on the first square wave signal. In one example, the second sinusoidal signal serves as an input to a second inverter at the second input.

In one example, the second inverter outputs at the second output a second square wave signal, wherein the second square wave signal is part of the synchronous square wave signal. In one example, the second square wave signal has a substantially same frequency as the second sinusoidal signal. In one example, the second capacitor operates as an alternating current (AC) coupler on the second square wave signal.

In one example, the low power differential circuit further includes a first buffer coupled to a first output capacitor, wherein the first buffer is coupled to the first inverter at the first output. In one example, the first buffer serves as an input for the first square wave signal. In one example, the low power differential circuit further includes a second buffer coupled to a second output capacitor, wherein the second buffer is coupled to the second inverter at the second output. In one example, the second buffer serves as an input for the second square wave signal. In one example, the synchronous square wave signal is coherent with the differential sinusoidal waveform.

Another aspect of the disclosure provides a method for generating a periodic signal, including: generating a differential sinusoidal waveform across two terminals of an oscillator; applying the differential sinusoidal waveform to a first high impedance inverter and a second high impedance inverter; limiting the differential sinusoidal waveform to generate a synchronous square wave signal; and buffering and delivering the synchronous square wave signal to a load.

In one example, the method further includes filtering and coupling the synchronous square wave signal to the oscillator. In one example, the differential sinusoidal waveform is applied to a first input terminal of the first high impedance inverter and a second input terminal of the second high impedance inverter. In one example, the first input terminal is a first gate terminal of a first field effect transistor (FET) circuit. In one example, the second input terminal is a second gate terminal of a second field effect transistor (FET) circuit.

In one example, the first FET circuit includes a first p-type metal oxide semiconductor (PMOS) transistor and a first n-type metal oxide semiconductor (NMOS) transistor. In one example, the second FET circuit includes a second p-type metal oxide semiconductor (PMOS) transistor and a second n-type metal oxide semiconductor (NMOS) transistor.

In one example, the method further includes using the first high impedance inverter and the second high impedance inverter to limit the synchronous square wave signal to either a positive level or a negative level. In one example, the method further includes limiting the synchronous square wave signal to a positive level when the differential sinusoidal waveform is positive. In one example, the method further includes limiting the synchronous square wave signal to a negative level when the differential sinusoidal waveform is negative. In one example, the synchronous square wave signal is coherent with the differential sinusoidal waveform.

Another aspect of the disclosure provides a computer-readable medium storing computer executable code, operable on a device including at least one processor and at least one memory coupled to the at least one processor, wherein the at least one processor is configured to implement a periodic signal, the computer executable code including:

instructions for causing a computer to generate a differential sinusoidal waveform across two terminals of an oscillator; instructions for causing the computer to apply the differential sinusoidal waveform to a first high impedance inverter and a second high impedance inverter; instructions for causing the computer to limit the differential sinusoidal waveform to generate a synchronous square wave signal; instructions for causing the computer to buffer and deliver the synchronous square wave signal to a load; and instructions for causing the computer to filter and couple the synchronous square wave signal to the oscillator.

These and other aspects of the present disclosure will become more fully understood upon a review of the detailed description, which follows. Other aspects, features, and implementations of the present disclosure will become apparent to those of ordinary skill in the art, upon reviewing the following description of specific, exemplary implementations of the present invention in conjunction with the accompanying figures. While features of the present invention may be discussed relative to certain implementations and figures below, all implementations of the present invention can include one or more of the advantageous features discussed herein. In other words, while one or more implementations may be discussed as having certain advantageous features, one or more of such features may also be used in accordance with the various implementations of the invention discussed herein. In similar fashion, while exemplary implementations may be discussed below as device, system, or method implementations it should be understood that such exemplary implementations can be implemented in various devices, systems, and methods.

BRIEF DESCRIPTION OF THE DRAWINGS

FIG. 5 illustrates an example flow diagram for generating a periodic signal.

DETAILED DESCRIPTION

Figure 1:
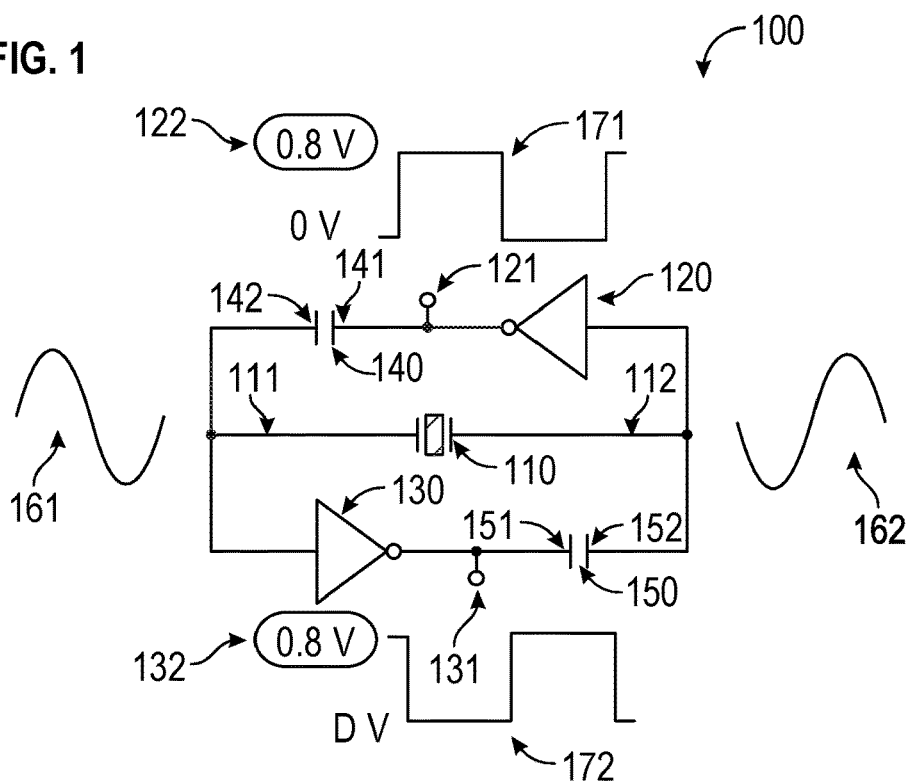
FIG. 1 illustrates a simplified block diagram example of a low power crystal oscillator circuit in accordance with the present disclosure.

The detailed description set forth below in connection with the appended drawings is intended as a description of various configurations and is not intended to represent the only configurations in which the concepts described herein may be practiced. The detailed description includes specific details for the purpose of providing a thorough understanding of various concepts. However, it will be apparent to those skilled in the art that these concepts may be practiced without these specific details. In some instances, well known structures and components are shown in block diagram form in order to avoid obscuring such concepts.

While for purposes of simplicity of explanation, the methodologies are shown and described as a series of acts, it is to be understood and appreciated that the methodologies are not limited by the order of acts, as some acts may, in accordance with one or more aspects, occur in different orders and/or concurrently with other acts from that shown and described herein. For example, those skilled in the art will understand and appreciate that a methodology could alternatively be represented as a series of interrelated states or events, such as in a state diagram. Moreover, not all illustrated acts may be required to implement a methodology in accordance with one or more aspects.

A frequency reference is an element used in electronic devices, for example, to generate various clock signals which regulate state transitions or sequence recurrent operations. Also, a frequency reference may be used as a source for other periodic waveforms such as local oscillators, carrier references, beacons, etc. Various types of frequency references may be used, for example, a crystal oscillator. A crystal oscillator uses piezoelectric properties of certain materials, for example, quartz, to generate a highly stable periodic signal (e.g. a sinusoidal waveform, a square wave signal, etc.). In one example, the crystal oscillator is embedded within a crystal oscillator circuit to provide proper biasing and control of the crystal oscillator to generate an oscillator output waveform.

In one example, the crystal oscillator circuit includes certain technical properties to satisfy various application needs. For example, phase noise, a measure of short-term stability in the frequency domain, may be very low, e.g., $-150$ dBc/Hz with phase noise spectral density at an offset frequency of 100 kHz. In one example, the crystal oscillator circuit may incorporate design features which maintain a low phase noise level. In one example, the phase noise is the measure of short-term stability in the frequency domain which may be a short-term decoherence of the oscillator output waveform, where short-term may imply a time scale less than 1 second.

In one example, the crystal oscillator circuit has very low dc current consumption, for example, much less than 1 mA of current consumption at its operational voltage, typically less than 1 volt. That is, the crystal oscillator circuit operates at low power (e.g, <1 mW). For example, low dc current consumption is required in emerging applications such as the Internet of Things (IoT), where a large quantity of remote devices may send data to a central server for subsequent processing. In this example, the remote devices may be low duty cycle devices where data acquisition and transmission occur intermittently with an active duration time much less than a recurring reporting period. In one example, a low duty cycle device may be active less than 1% of the recurring reporting period. For example, the low duty cycle device may utilize an always on oscillator which may represent the major dc current consumer in the device.

In one example, the crystal oscillator circuit includes a differential output (i.e., two oscillator outputs referenced relative to each other) rather than a single-ended output (i.e., one oscillator output relative to a common ground reference). For example, a differential output provides improved noise immunity against various noise sources such as common-mode noise. In one example, the differential output minimizes spurious signal generation. For example, the differential output avoids signal matching problems which occur with a single-ended output converted to a differential form with inverters. The converted single-ended output may introduce undesired differential signal delays from the inverters.

Some crystal oscillator circuits may have low phase noise and differential outputs but may not operate with low dc current consumption (e.g. <1 mA) or low dc power (e.g., <1 mW). For example, some crystal oscillator circuits may connect crystal oscillator terminals to transistor drain or source terminals. In one example, the present disclosure discloses a crystal oscillator circuit with low phase noise, differential outputs and operates with low dc power.

FIG. 1 illustrates a simplified block diagram example of a low power crystal oscillator circuit 100 in accordance with the present disclosure. For example, the crystal oscillator circuit 100 includes a crystal oscillator 110 with a first terminal 111 and a second terminal 112. In one example, the crystal oscillator 110 is a quartz crystal oscillator. For example, the first terminal 111 of the crystal oscillator 110 is connected to an input of a first inverter 130 and to a first capacitor 140. For example, the second terminal 112 of the crystal oscillator 110 is connected to an input of a second inverter 120 and to a second capacitor 150. In one example, the first inverter 130 is a high impedance inverter. In one example, the high impedance inverter output is isolated from its input. In one example, the second inverter 120 is a high impedance inverter. For example, a high impedance inverter may draw an input current of less than 1 microamps.

In one example, the crystal oscillator 110 generates a first sinusoidal signal 161 having a first phase offset at the first terminal 111 of the crystal oscillator 110. In one example, the crystal oscillator 110 generates a second sinusoidal signal 162 having a second phase offset at the second terminal 112 of the crystal oscillator 110. For example, a difference of the first phase offset and the second phase offset is 180 degrees, within a phase tolerance. In one example, the phase tolerance is +/−1 degree or smaller.

In one example, a difference between the first sinusoidal signal 161 and the second sinusoidal signal 162 generates a differential sinusoidal waveform. For example, the first sinusoidal signal 161 and the second sinusoidal signal 162 are part of the differential sinusoidal waveform.

In one example, the first sinusoidal signal 161 serves as an input to the first inverter 130. The first inverter includes a first output 131. In one example, the first inverter 130 operates with a first dc voltage 132 of 0.8 volts. In one example, the first output 131 is a first square wave signal 172 with a same (i.e., substantially the same) frequency as the first sinusoidal signal 161. As shown in the example of FIG. 1, the first output 131 is connected to a first terminal 151 of the first capacitor 150. In one example, the second sinusoidal signal 162 is regenerated at a second terminal 152 of the first capacitor 150. In one example, the first capacitor 150 operates as an alternating current (AC) coupler to feed the first square wave signal 172 into the crystal oscillator 110. In one example, the crystal oscillator 110 acts as a bandpass filter with high Q. In one example, the first capacitor 150 improves phase noise by keeping the first output 131 as the first square wave signal 172.

In one example, the second sinusoidal signal 162 serves as an input to a second inverter 120. The second inverter includes a second output 121. In one example, the second inverter 120 operates with a second dc voltage 122 of 0.8 volts. In one example, the second output 121 is a second square wave signal 171 with a same (i.e., substantially the same) frequency as the second sinusoidal signal 162. In one example, the second output 121 is connected to a first terminal 141 of a second capacitor 140. For example, the first sinusoidal signal 161 is regenerated at a second terminal 142 of the second capacitor 140. In one example, the second capacitor 140 operates in a similar role as the first capacitor 150 since the low power crystal oscillator circuit 100 is fully differential.

In one example, a difference between the first square wave signal 172 and the second square wave signal 171 generates a synchronous square wave signal. For example, the synchronous square wave signal is coherent with the differential sinusoidal waveform. For example, the first square wave signal 172 and the second square wave signal 171 are part of the synchronous square wave.

In one example, the first sinusoidal signal 161 is not limited by the first dc voltage 132 and the second sinusoidal signal 162 is not limited by the second dc voltage 122. In one example, the first square wave signal 172 is limited by the first dc voltage 132 and the second square wave signal 171 is limited by the second dc voltage 122. For example, the first sinusoidal signal 161 and the second sinusoidal signal 162 may have a phase noise spectral density below −150 dBc/Hz at an offset frequency of 100 kHz. In one example, the first inverter 130 and the second inverter 120 are self-biased inverters. For example, the first square wave signal 172 and the second square wave signal 171 may be distributed to a load.

Figure 2:
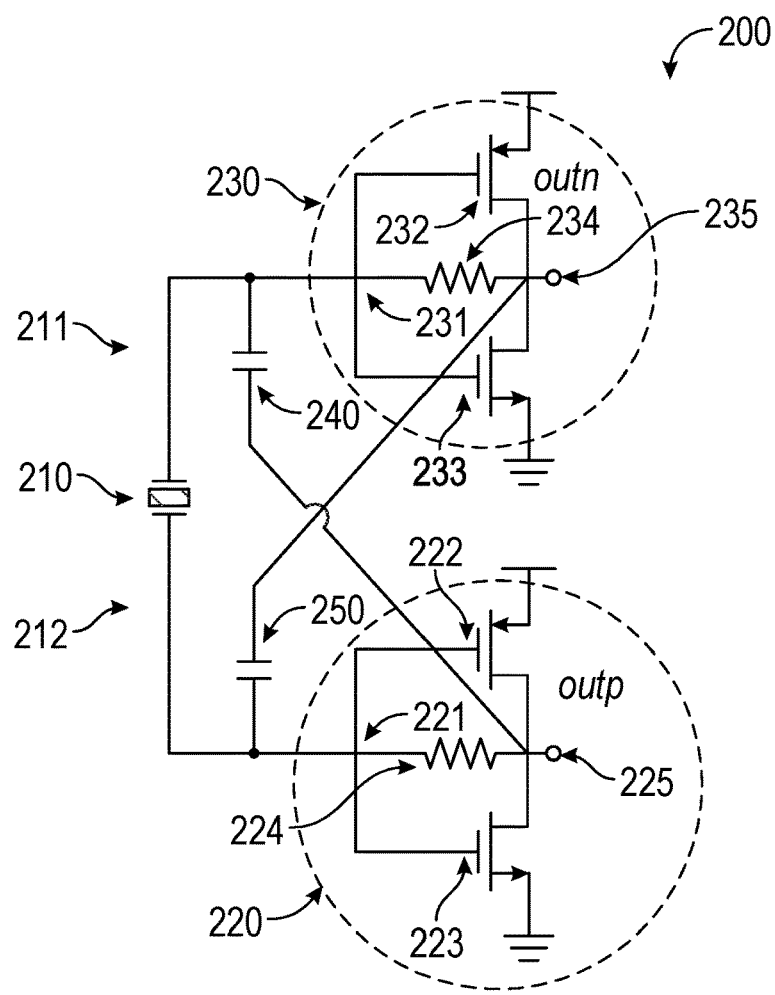
FIG. 2 illustrates a schematic diagram example of a low power crystal oscillator circuit 200 in accordance with the present disclosure.

FIG. 2 illustrates a schematic diagram example of a low power crystal oscillator circuit 200 in accordance with the present disclosure. In one example, the low power crystal oscillator circuit 200 includes a crystal oscillator 210 with a first terminal 211 and a second terminal 212. In one example, the crystal oscillator 210 is a quartz crystal oscillator. As shown in the example, the first terminal 211 of the crystal oscillator 210 is connected to an input 231 of a first inverter 230 and to a first capacitor 240. For example, the second terminal 212 of the crystal oscillator 210 is connected to an input 221 of a second inverter 220 and to a second capacitor 250.

In one example, the first inverter 230 includes a first PMOS transistor 232, a first NMOS transistor 233 and a first resistor 234. The first inverter 230 includes an output 235. In one example, the second inverter 220 includes a second PMOS transistor 222, a second NMOS transistor 223 and a second resistor 224. The second inverter 220 includes an output 225.

In one example, the input 231 of the first inverter 230 is connected to a gate terminal of the first PMOS transistor 232 and to a gate terminal of the first NMOS transistor 233. In one example, the input 221 of the second inverter 220 is connected to a gate terminal of the second PMOS transistor 222 and to a gate terminal of the second NMOS transistor 223.

Figures 3, 4:
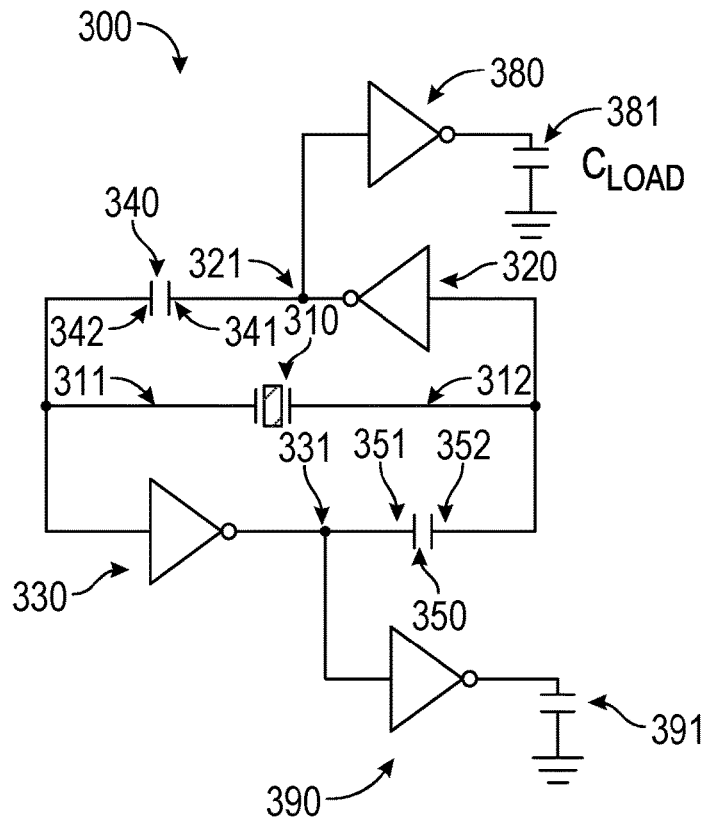
FIG. 3 illustrates a simplified block diagram example of a low power crystal oscillator circuit with output buffers in accordance with the present disclosure.
FIG. 4 illustrates an example of various performance metrics for the low power crystal oscillator circuit with output buffers in a tabular format with rows and columns.

FIG. 3 illustrates a simplified block diagram example of a low power crystal oscillator circuit 300 with output buffers in accordance with the present disclosure. In one example, the crystal oscillator circuit 300 includes a crystal oscillator 310 with a first terminal 311 and a second terminal 312. In one example, the crystal oscillator 310 is a quartz crystal oscillator. For example, the first terminal 311 of the crystal oscillator 310 is connected to an input of a first inverter 330 and to a first capacitor 340. For example, the second terminal 312 of the crystal oscillator 310 is connected to an input of a second inverter 320 and to a second capacitor 350.

In one example, the crystal oscillator 310 generates a first sinusoidal signal (not shown) having a first phase offset at the first terminal 311 of the crystal oscillator 310. In one example, the crystal oscillator 310 generates a second sinusoidal signal (not shown) having a second phase offset at the second terminal 312 of the crystal oscillator 310. For example, a difference of the first phase offset and the second phase offset is 180 degrees, within a phase tolerance. In one example, the phase tolerance is +/−1 degree or smaller.

In one example, the first sinusoidal signal serves as an input to a first inverter 330 with a first output 331. In one example, the first output 331 is a first square wave signal (not shown) with a same (i.e., substantially the same)

frequency as the first sinusoidal signal. In one example, the first output 331 is connected to a first terminal 351 of a first capacitor 350. For example, the second sinusoidal signal is generated at a second terminal 352 of the first capacitor 350. In one example, the first capacitor 350 operates as an alternating current (AC) coupler on the first square wave signal.

In one example, the second sinusoidal signal serves as an input to a second inverter 320 with a second output 321. In one example, the second output 321 is a second square wave signal (not shown) with a same (i.e., substantially the same) frequency as the second sinusoidal signal. In one example, the second output 321 is connected to a first terminal 341 of a second capacitor 340. For example, the first sinusoidal signal is generated at a second terminal 342 of the second capacitor 340. In one example, the second capacitor 340 operates as an alternating current (AC) coupler on the second square wave signal.

In one example, the first sinusoidal signal is not limited by the dc voltage of the first inverter 330. And, in one example, the second sinusoidal signal is not limited by the dc voltage of the second inverter 320. In one example, neither the first sinusoidal signal nor the second sinusoidal signal is limited by either of the dc voltages of the first inverter 330 and the second inverter 320.

In one example, the first inverter 330 and the second inverter 320 are self-biased inverters. For example, the first square wave signal serves an input to a first buffer 380 with a first output capacitor 381. In one example, the second square wave signal serves an input to a second buffer 390 with a second output capacitor 391. In one example, the first buffer 380 and the second buffer 390 have improved dc power efficiency with a square wave signal input compared to a sinusoidal signal input. In one example, the first buffer 380 isolates the first inverter 330 from the load impedance. In one example, the second buffer 390 isolates the second inverter 320 from the load impedance. That is, the first buffer 380 and the second buffer 390 isolate their inputs from their outputs.

FIG. 4 illustrates an example 400 of various performance metrics for the low power crystal oscillator circuit with output buffers in a tabular format with rows and columns. For example, each column of the tabular format represents a particular operating condition (e.g., corner case). For example, the columns represent the following operating conditions: Typical, Fast/Fast Cold, Fast/Fast Hot, Slow/Slow Cold, Slow/Slow Hot, Slow/Fast Cold, Slow/Fast Hot, Fast/Slow Cold, Fast/Slow Hot. For example, the rows represent the following performance metrics: core current (microamp), load buffer current (microamp), phase noise at 1 MHz frequency offset, phase noise at 100 kHz frequency offset, phase noise at 10 kHz frequency offset.

FIG. 5 illustrates an example flow diagram 500 for generating a periodic signal. For example, the periodic signal maybe a sinusoidal waveform or a square wave signal. In block 510, generate a differential sinusoidal waveform across two terminals of an oscillator. In one example, the oscillator is a crystal oscillator. In block 520, apply the differential sinusoidal waveform to a first input terminal of a first high impedance inverter and a second input terminal of a second high impedance inverter. In one example, the first input terminal is a first gate terminal of a first field effect transistor (FET) circuit. In one example, the second input terminal is a second gate terminal of a second FET circuit. In one example, the first FET circuit includes a first p-type metal oxide semiconductor (PMOS) transistor and a first n-type metal oxide semiconductor (NMOS) transistor. In one example, the second FET circuit includes a second p-type metal oxide semiconductor (PMOS) transistor and a second n-type metal oxide semiconductor (NMOS) transistor.

In block 530, limit the differential sinusoidal waveform to generate a synchronous square wave signal. In one example, the synchronous square wave signal is limited to a positive level when the differential sinusoidal waveform is positive and limited to a negative level when the differential sinusoidal waveform is negative. In one example, the synchronous square wave signal is coherent with the differential sinusoidal waveform. In one example, the limiting is performed by the first high impedance inverter and the second high impedance inverter.

In block 540, buffer and deliver the synchronous square wave signal to a load. In one example, the load uses the synchronous square wave signal as a frequency reference. In one example, the load uses the synchronous square wave signal to derive a time reference. In one example, buffer means to isolate an input to a device from its output. In one example, deliver means to connect an output of a device to a load. In block 550, filter and couple the synchronous square wave signal to the oscillator. In one example, filter means to shape a signal to vary its frequency content. In one example, couple means to connect a signal to another device.

In one aspect, one or more of the steps for providing a low power differential crystal oscillator circuit in FIG. 5 may be executed by one or more processors which may include hardware, software, firmware, etc. In one aspect, one or more of the steps in FIG. 5 may be executed by one or more processors which may include hardware, software, firmware, etc. The one or more processors, for example, may be used to execute software or firmware needed to perform the steps in the flow diagram of FIG. 5. Software shall be construed broadly to mean instructions, instruction sets, code, code segments, program code, programs, subprograms, software modules, applications, software applications, software packages, routines, subroutines, objects, executables, threads of execution, procedures, functions, etc., whether referred to as software, firmware, middleware, microcode, hardware description language, or otherwise.

The software may reside on a computer-readable medium. The computer-readable medium may be a non-transitory computer-readable medium. A non-transitory computer-readable medium includes, by way of example, a magnetic storage device (e.g., hard disk, floppy disk, magnetic strip), an optical disk (e.g., a compact disc (CD) or a digital versatile disc (DVD)), a smart card, a flash memory device (e.g., a card, a stick, or a key drive), a random access memory (RAM), a read only memory (ROM), a programmable ROM (PROM), an erasable PROM (EPROM), an electrically erasable PROM (EEPROM), a register, a removable disk, and any other suitable medium for storing software and/or instructions that may be accessed and read by a computer. The computer-readable medium may also include, by way of example, a carrier wave, a transmission line, and any other suitable medium for transmitting software and/or instructions that may be accessed and read by a computer. The computer-readable medium may reside in a processing system, external to the processing system, or distributed across multiple entities including the processing system. The computer-readable medium may be embodied in a computer program product. By way of example, a computer program product may include a computer-readable medium in packaging materials. The computer-readable medium may include software or firmware for placement and/or routing of element(s) of a crystal oscillator circuit. Those skilled in the art will recognize how best to implement the described functionality presented throughout this disclosure depending on the particular application and the overall design constraints imposed on the overall system.

Any circuitry included in the processor(s) is merely provided as an example, and other means for carrying out the described functions may be included within various aspects of the present disclosure, including but not limited to the instructions stored in the computer-readable medium, or any other suitable apparatus or means described herein, and utilizing, for example, the processes and/or algorithms described herein in relation to the example flow diagram.

Within the present disclosure, the word "exemplary" is used to mean "serving as an example, instance, or illustration." Any implementation or aspect described herein as "exemplary" is not necessarily to be construed as preferred or advantageous over other aspects of the disclosure. Likewise, the term "aspects" does not require that all aspects of the disclosure include the discussed feature, advantage or mode of operation. The term "coupled" is used herein to refer to the direct or indirect coupling between two objects. For example, if object A physically touches object B, and object B touches object C, then objects A and C may still be considered coupled to one another—even if they do not directly physically touch each other. For instance, a first die may be coupled to a second die in a package even though the first die is never directly physically in contact with the second die. The terms "circuit" and "circuitry" are used broadly, and intended to include both hardware implementations of electrical devices and conductors that, when connected and configured, enable the performance of the functions described in the present disclosure, without limitation as to the type of electronic circuits, as well as software implementations of information and instructions that, when executed by a processor, enable the performance of the functions described in the present disclosure.

One or more of the components, steps, features and/or functions illustrated in the figures may be rearranged and/or combined into a single component, step, feature or function or embodied in several components, steps, or functions. Additional elements, components, steps, and/or functions may also be added without departing from novel features disclosed herein. The apparatus, devices, and/or components illustrated in the figures may be configured to perform one or more of the methods, features, or steps described herein. The novel algorithms described herein may also be efficiently implemented in software and/or embedded in hardware.

It is to be understood that the specific order or hierarchy of steps in the methods disclosed is an illustration of exemplary processes. Based upon design preferences, it is understood that the specific order or hierarchy of steps in the methods may be rearranged. The accompanying method claims present elements of the various steps in a sample order, and are not meant to be limited to the specific order or hierarchy presented unless specifically recited therein.

The previous description is provided to enable any person skilled in the art to practice the various aspects described herein. Various modifications to these aspects will be readily apparent to those skilled in the art, and the generic principles defined herein may be applied to other aspects. Thus, the claims are not intended to be limited to the aspects shown herein, but are to be accorded the full scope consistent with the language of the claims, wherein reference to an element in the singular is not intended to mean "one and only one" unless specifically so stated, but rather "one or more."

Unless specifically stated otherwise, the term "some" refers to one or more. A phrase referring to "at least one of" a list of items refers to any combination of those items, including single members. As an example, "at least one of: a, b, or c" is intended to cover: a; b; c; a and b; a and c; b and c; and a, b and c. All structural and functional equivalents to the elements of the various aspects described throughout this disclosure that are known or later come to be known to those of ordinary skill in the art are expressly incorporated herein by reference and are intended to be encompassed by the claims. Moreover, nothing disclosed herein is intended to be dedicated to the public regardless of whether such disclosure is explicitly recited in the claims. No claim element is to be construed under the provisions of 35 U.S.C. § 112, sixth paragraph, unless the element is expressly recited using the phrase "means for" or, in the case of a method claim, the element is recited using the phrase "step for."

What is claimed is:

1. A differential circuit, comprising:
   a crystal oscillator to generate a differential sinusoidal waveform, the crystal oscillator having a first terminal and a second terminal;
   a first capacitor coupled to the first terminal;
   a first inverter including a first input coupled to the first terminal and a first output coupled to a second capacitor;
   wherein, the second capacitor coupled to the second terminal; and
   a second inverter including a second input coupled to the second terminal and a second output coupled to the first capacitor, wherein the first inverter and the second inverter generate a synchronous square wave signal, wherein the differential sinusoidal waveform includes a phase noise level no greater than −155.3 dBc/Hz at 10 kHz frequency offset and no greater than −162 dBc/Hz at 100 kHz frequency offset.

2. The differential circuit of claim 1, wherein the crystal oscillator generates a first sinusoidal signal having a first phase offset at the first terminal and wherein the first sinusoidal signal is part of the differential sinusoidal waveform.

3. The differential circuit of claim 2, wherein the crystal oscillator further generates a second sinusoidal signal having a second phase offset at the second terminal and wherein the second sinusoidal signal is part of the differential sinusoidal waveform.

4. The differential circuit of claim 3, wherein a difference of the first phase offset and the second phase offset is approximately 180 degrees within a phase tolerance.

5. The differential circuit of claim 4, wherein the phase tolerance is +/−1 degree or smaller.

6. The differential circuit of claim 3, wherein the first sinusoidal signal serves as an input to the first inverter at the first input.

7. The differential circuit of claim 6, wherein the first inverter outputs a first square wave signal at the first output, wherein the first square wave signal is part of the synchronous square wave signal.

8. The differential circuit of claim 7, wherein the first square wave signal has a substantially same frequency as the first sinusoidal signal.

9. The differential circuit of claim 7, wherein the second capacitor operates as an alternating current (AC) coupler on the first square wave signal.

10. The differential circuit of claim 9, wherein the second sinusoidal signal serves as an input to a second inverter at the second input.

11. The differential circuit of claim 10, wherein the second inverter outputs at the second output a second square wave signal, wherein the second square wave signal is part of the synchronous square wave signal.

12. The differential circuit of claim 11, wherein the second square wave signal has a substantially same frequency as the second sinusoidal signal.

13. The differential circuit of claim 12, wherein the first capacitor operates as an alternating current (AC) coupler on the second square wave signal.

14. The differential circuit of claim 13, further comprising a first buffer coupled to a first output capacitor, wherein the first buffer is coupled to the first inverter at the first output.

15. The differential circuit of claim 14, wherein the first buffer serves as an input for the first square wave signal.

16. The differential circuit of claim 15, further comprising a second buffer coupled to a second output capacitor, wherein the second buffer is coupled to the second inverter at the second output.

17. The differential circuit of claim 16, wherein the second buffer serves as an input for the second square wave signal.

18. A method for generating a periodic signal, comprising:
generating a differential sinusoidal waveform across two terminals of an oscillator;
applying the differential sinusoidal waveform to a first inverter and a second inverter;
limiting the differential sinusoidal waveform to generate a synchronous square wave signal; and
buffering and delivering the synchronous square wave signal to a load, wherein the differential sinusoidal waveform includes a phase noise level no greater than −155.3 dBc/Hz at 10 kHz frequency offset and no greater than −162 dBc/Hz at 100 kHz frequency offset.

19. The method of claim 18, further comprising filtering and coupling the synchronous square wave signal to the oscillator.

20. The method of claim 19, wherein the differential sinusoidal waveform is applied to a first input terminal of the first inverter and a second input terminal of the second inverter.

21. The method of claim 20, wherein the first input terminal is a first gate terminal of a first field effect transistor (FET) circuit.

22. The method of claim 21, wherein the second input terminal is a second gate terminal of a second field effect transistor (FET) circuit.

23. The method of claim 22, wherein the first field effect transistor (FET) circuit includes a first p-type metal oxide semiconductor (PMOS) transistor and a first n-type metal oxide semiconductor (NMOS) transistor.

24. The method of claim 23, wherein the second field effect transistor (FET) circuit includes a second p-type metal oxide semiconductor (PMOS) transistor and a second n-type metal oxide semiconductor (NMOS) transistor.

25. The method of claim 18, further comprising using the first inverter and the second inverter to limit the synchronous square wave signal to either a positive level or a negative level.

26. The method of claim 25, further comprising limiting the synchronous square wave signal to a positive level when the differential sinusoidal waveform is positive.

27. The method of claim 25, further comprising limiting the synchronous square wave signal to a negative level when the differential sinusoidal waveform is negative.

28. A computer-readable medium storing computer executable code, operable on a device comprising at least one processor and at least one memory coupled to the at least one processor, wherein the at least one processor is configured to implement a periodic signal, the computer executable code comprising:
instructions for causing a computer to generate a differential sinusoidal waveform across two terminals of an oscillator;
instructions for causing the computer to apply the differential sinusoidal waveform to a first inverter and a second inverter;
instructions for causing the computer to limit the differential sinusoidal waveform to generate a synchronous square wave signal;
instructions for causing the computer to buffer and deliver the synchronous square wave signal to a load; and
instructions for causing the computer to filter and couple the synchronous square wave signal to the oscillator, wherein the differential sinusoidal waveform includes a phase noise slope level no greater than −155.3 dBc/Hz at 10 kHz frequency offset and no greater than −162 dBc/Hz at 100 kHz frequency offset.

* * * * *